US005776296A

United States Patent [19]

Matthews

[11] Patent Number: 5,776,296
[45] Date of Patent: Jul. 7, 1998

[54] APPARATUS FOR THE TREATMENT OF SEMICONDUCTOR WAFERS IN A FLUID

[75] Inventor: Robert Roger Matthews, Richmond, Calif.

[73] Assignee: Legacy Systems, Inc., Fremont, Calif.

[21] Appl. No.: 507,193

[22] Filed: Jul. 26, 1995

Related U.S. Application Data

[62] Division of Ser. No. 92,523, Jul. 16, 1993, Pat. No. 5,464,480.

[51] Int. Cl.⁶ ..................................................... B08B 3/10
[52] U.S. Cl. .................. 156/345; 261/122.1; 134/102.2; 134/902
[58] Field of Search .......................... 156/345; 134/37, 134/102.1, 102.2, 902; 261/122.1

[56] References Cited

U.S. PATENT DOCUMENTS

| | | |
|---|---|---|
| 3,150,070 | 9/1964 | Ogawa . |
| 3,365,807 | 1/1968 | Williamson . |
| 3,421,999 | 1/1969 | Corwin . |
| 3,559,297 | 2/1971 | Figiel . |
| 3,653,983 | 4/1972 | Ziehr et al. . |
| 3,711,072 | 1/1973 | Waldenville . |
| 3,970,731 | 7/1976 | Oksman ........................... 261/122.1 |
| 4,007,240 | 2/1977 | Gosden . |
| 4,046,845 | 9/1977 | Veeder . |
| 4,090,307 | 5/1978 | Gollmick et al. . |
| 4,261,933 | 4/1981 | Ewing et al. . |
| 4,307,518 | 12/1981 | Izumo et al. . |
| 4,543,130 | 9/1985 | Shwartzman . |
| 4,572,821 | 2/1986 | Brodard et al. . |
| 4,622,151 | 11/1986 | Hiltebrand et al. . |
| 4,633,893 | 1/1987 | McConnell et al. . |
| 4,722,355 | 2/1988 | Moe et al. . |
| 4,740,249 | 4/1988 | McConnell . |
| 4,745,690 | 5/1988 | Koop et al. . |
| 4,778,532 | 10/1988 | McConnell et al. . |
| 4,795,497 | 1/1989 | McConnell et al. . |

(List continued on next page.)

FOREIGN PATENT DOCUMENTS

| | | |
|---|---|---|
| 0 385 536 | 2/1990 | European Pat. Off. . |
| 0 497 247 | 8/1992 | European Pat. Off. . |
| 198127 | 9/1987 | Japan . |
| 62291928 | 12/1987 | Japan . |
| 63084119 | 4/1988 | Japan . |
| 1-69014 | 5/1989 | Japan . |
| 3136329 | 10/1989 | Japan . |
| 136329 | 6/1991 | Japan . |
| 146616 | 5/1992 | Japan . |
| 4-199620 | 7/1992 | Japan . |
| 4-348029 | 12/1992 | Japan . |
| 5-114594 | 5/1993 | Japan . |
| 152268 | 6/1993 | Japan . |
| 5166776 | 7/1993 | Japan . |
| 5152268 | 9/1993 | Japan . |

OTHER PUBLICATIONS

Gadgil, "Single Wafer Processing in Stagnation Point Flow CVD Reactor: Prospects, Constraints, and Reactor Design," *Journal of Electronic Materials*, vol. 22, No. 2, pp. 171–177 (Feb. 1993).

Ohmi et al., "Native Oxide Growth and Organic Impurity Removal on Si Surface with Ozone-Injected Ultrapure Water," *Journal of Electrochemical Society*, vol. 140, No. 3, pp. 804–810 (Mar. 1993).

*Primary Examiner*—Thi Dang
*Attorney, Agent, or Firm*—Burns, Doane, Swecker and Mathis, LLP

[57] ABSTRACT

Provided is a process for removing organic materials from semiconductor wafers. The process involves the use of subambient deionized water with ozone absorbed into the water. The ozonated water flows over the wafers and the ozone oxidizes the organic materials from the wafers to insoluble gases. The ozonated water may be prepared in-situ by diffusing ozone into a tank containing wafers and subambient deionized water.

Also provided is a tank for the treatment of semiconductor wafers with a fluid and a gas diffuser for diffusion of gases directly into fluids in a wafer treatment tank.

11 Claims, 2 Drawing Sheets

U.S. PATENT DOCUMENTS

| | | |
|---|---|---|
| 4,852,516 | 8/1989 | Rubin et al. . |
| 4,856,544 | 8/1989 | McConnell . |
| 4,876,801 | 10/1989 | Gehring et al. . |
| 4,899,767 | 2/1990 | McConnell et al. . |
| 4,917,123 | 4/1990 | McConnell et al. . |
| 4,924,890 | 5/1990 | Giles et al. . |
| 4,960,141 | 10/1990 | Lenck et al. . |
| 4,984,597 | 1/1991 | McConnell et al. . |
| 5,000,795 | 3/1991 | Chung et al. ............... 134/37 |
| 5,014,727 | 5/1991 | Aigo ................... 261/122.1 |
| 5,045,120 | 9/1991 | Mittag et al. . |
| 5,049,320 | 9/1991 | Wang et al. . |
| 5,051,137 | 9/1991 | Nold . |
| 5,071,488 | 12/1991 | Takayama et al. . |
| 5,082,518 | 1/1992 | Molinaro . |
| 5,102,777 | 4/1992 | Lin et al. . |
| 5,135,391 | 8/1992 | Chhabra . |
| 5,183,067 | 2/1993 | Slinn . |
| 5,186,841 | 2/1993 | Schick . |
| 5,201,958 | 4/1993 | Breunsbach et al. . |
| 5,279,316 | 7/1994 | Miranda . |

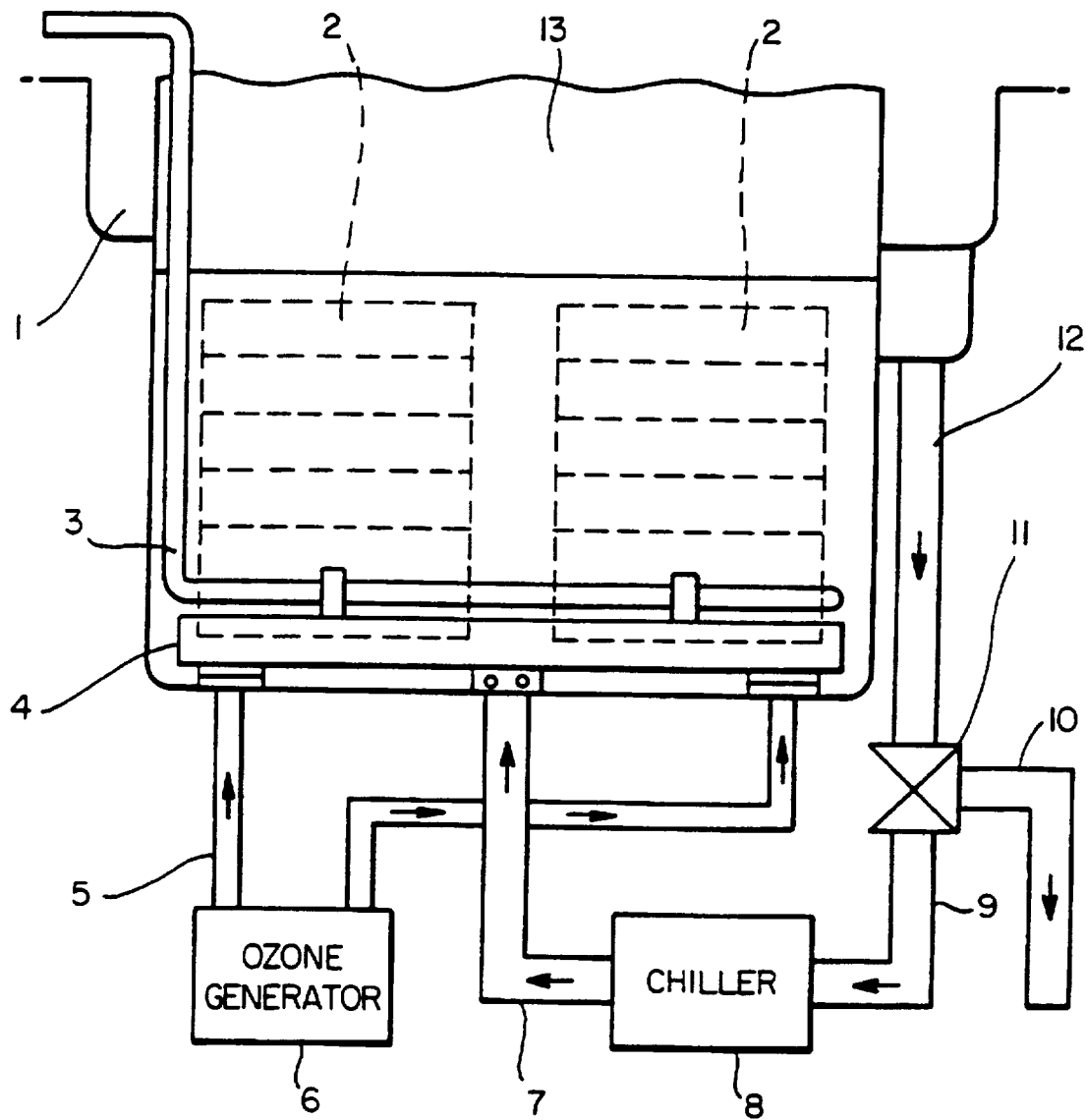
FIG_1

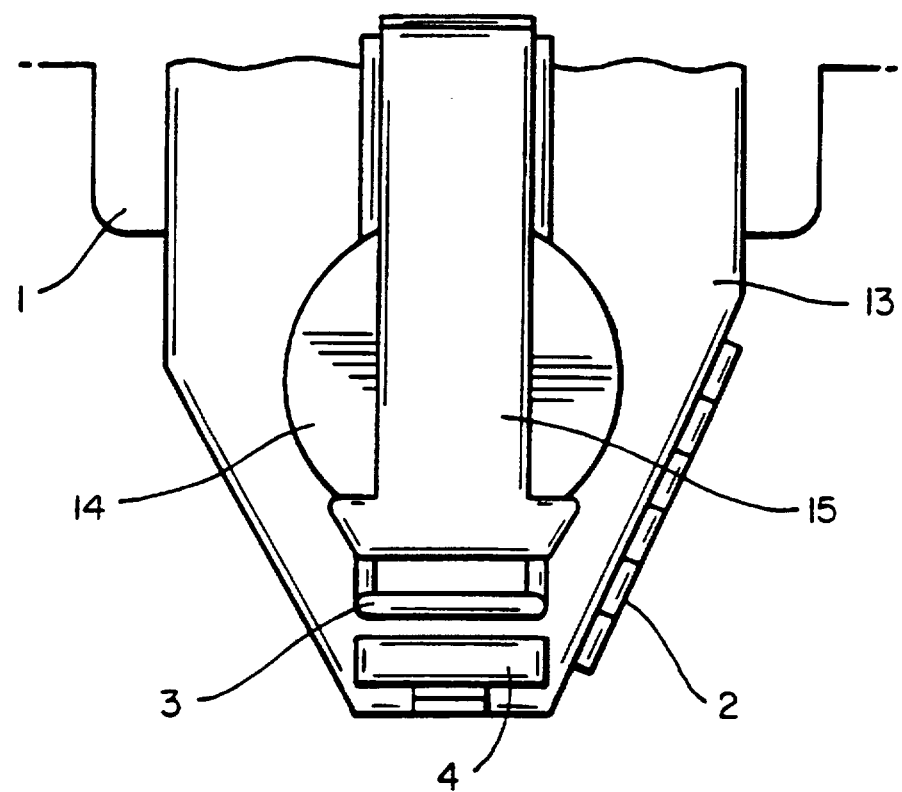
FIG_2
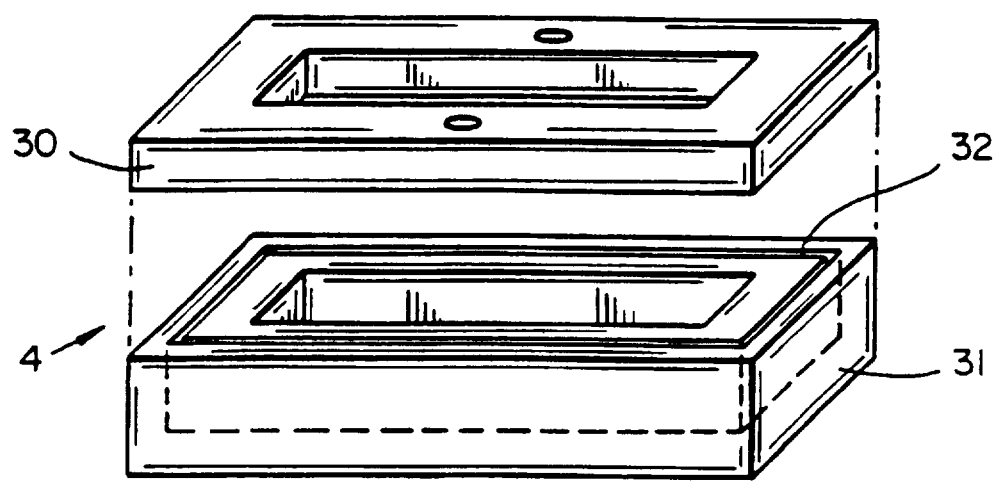
FIG_3

APPARATUS FOR THE TREATMENT OF SEMICONDUCTOR WAFERS IN A FLUID

This application is a divisional of application Ser. No. 08/092,523, filed Jul. 16, 1993, now U.S. Pat. No. 5,464,480.

FIELD OF THE INVENTION

The present invention relates to semiconductor manufacturing. More specifically, the invention involves an improved process for removing organic material from wafers during the wet etch/clean steps of wafer fabrication. The present invention also relates to an apparatus for carrying out this process and other processes involving wafer treatment with a fluid conducted during semiconductor manufacture.

BACKGROUND OF THE INVENTION

In the fabrication of semiconductor wafers several process steps require contacting the wafers with fluids. Examples of such process steps include etching, photoresist stripping, and prediffusion cleaning. Often the chemicals utilized in these steps are quite hazardous in that they may comprise strong acids, alkalis, or volatile solvents.

The equipment conventionally used for contacting semiconductor wafers with process fluid consists of a series of tanks or sinks into which cassette loads of semiconductor wafers are dipped. Such conventional wet processing equipment poses several difficulties.

First, moving the wafers from tank to tank may result in contamination, which contamination is extremely detrimental to the microscopic circuits which the fabrication process creates. Second, the hazardous chemicals and deionized water which are used have to be regularly replaced with new solutions, usually introduced to the tank by bottle pour, chemical distribution or from building facilities in the case of deionized water. The chemicals generally are manufactured by chemical companies and shipped to the semiconductor manufacturing plant. The chemical purity is thus limited by the quality of the water used by the chemical manufacturers, by the container used for shipping and storing the chemical and by the handling of the chemical.

Moreover, as chemicals age, they can become contaminated with impurities from the air and from the wafers. The treatment of the last batch of wafers prior to fluid rejuvenation may not be as effective as treatment of the first batch of wafers in a new solution. Non-uniform treatment is a major concern in semiconductor manufacturing.

Some of the fluid contact steps of semiconductor manufacture include removal of organic materials and impurities from the wafer surface. For example, in the manufacture of integrated circuits, it is customary to bake a photoresist coating onto a silicon wafer as part of the manufacturing process. This coating of photoresist or organic material must be removed after processing.

Generally, a wet photoresist strip process is performed by a solution of sulfuric acid spiked with an oxidizer of either hydrogen peroxide or ozone. This process is referred to in U.S. Pat. Nos. 4,899,767 and 4,917,123, issued to CFM Technologies. However, there are many disadvantages to using a solution of sulfuric acid and an oxidizer to strip photoresist from wafers during semiconductor manufacture. First, the by-product of the resist strip reaction when hydrogen peroxide is used as the oxidizer is water, which dilutes the concentration of the bath and thereby reduces its ability to strip photoresist. Second, this process operates at a high temperature, generally between 80° and 150° C., typically above about 130° C., which mandates the use of special heat resistant materials and components in order to house, circulate and filter the solution, as well as requires extra energy to conduct the cleaning process. Third, the solution is hazardous to handle and dispose of and expensive to manufacture, transport and store.

Moreover, due to the build-up of impurities both dissolved and undissolved in the process bath, the solution must be changed periodically. Typically, the interval for chemical change out is about every eight hours. Because the chemical adversely affects the drain plumbing, the solution must be cooled to less than about 90° C. prior to disposal. Thus, use of this photoresist stripping process requires either the use of additional tanks to contain the hot solution or the shut down of the process station during the chemical change period, reducing wafer throughput and increasing cost of ownership.

Finally, after use of a sulfuric acid solution for removal of photoresist, the wafers must be rinsed in hot deionized water since sulfate residues may crystallize on the wafer during processing causing process defects.

Another process often utilized for the removal of organic and metallic surface contaminants is the "RCA clean" process which uses a first solution of ammonium hydroxide, hydrogen peroxide, and water and a second solution of hydrochloric acid, hydrogen peroxide, and water. The RCA cleaning solutions typically are mixed in separate tanks. The wafers are first subjected to cleaning by the ammonium hydroxide solution, then are moved to a rinse tank, then to a tank containing the hydrochloric acid cleaning solution, and then to a final rinse tank. This process, like the sulfuric acid process, has the disadvantage of using strong chemicals. Moreover, the wafers are exposed to air during the transfers from tank to tank, allowing for contamination. Finally, the use of peroxide may cause the wafers to suffer aluminum contamination from the deposition of aluminum in the high pH ammonium hydroxide solution which is not totally removed in the hydrochloric solution.

Various approaches have been taken to improving the processes and equipment used to treat semiconductor wafers with fluid. These attempts to improve on present processes generally involve either a change in equipment or a change in the process chemicals.

One approach to eliminating problems with contamination of wafers during fluid treatment is disclosed in U.S. Pat. Nos. 4,778,532, 4,795,497, 4,899,767 and 4,917,123. These patents describe an enclosed full-flow method and apparatus which allows the process fluids to flow sequentially and continuously past the wafers without movement or operator handling of the wafers between processing steps. However, these patents still teach the use of hazardous chemicals to perform the fluid treatment and cleaning of the wafers. Moreover, the equipment needed for the enclosed apparatus is limited in wafer throughput since all process sequences are performed in the same vessel with concentrated solutions.

U.S. Pat. No. 4,899,767 teaches the use of a separate mixing tank for preparing the sulfuric acid and oxidizer solution, which solution must then be delivered into the treatment tank. The reason for the separate tank is to eliminate the possibility of an explosion due to pressure build up from the decomposition of hydrogen peroxide into oxygen and water.

U.S. Pat. No. 5,082,518, issued to SubMicron Systems, Inc., describes a different approach to improving the sulfuric acid and oxidizer process of cleaning semiconductor wafers. The system in this patent provides a gas distribution system which includes a sparger plate with diffusion holes for distributing gas throughout the bath in the tank. Thus, rather than using a separate tank for mixing as in U.S. Pat. No. 4,899,767, the SubMicron patent provides an apparatus which distributes ozone directly into the treatment tank containing sulfuric acid. It has been found, however, that this diffusion system suffers several disadvantages. First, the efficiency of ozone distribution and absorption into the water is lessened by the large bubbles of ozone produced by the apparatus. The amount of ozone absorbed is important to its ability to react with the sulfuric acid to remove organic materials from the wafers. Moreover, the type of diffusing element described in U.S. Pat. No. 5,082,518 is believed to not uniformly distribute ozone throughout the tank. Finally, as with previous attempts to improve cleaning processes for wafers, hazardous chemicals are required, creating handling and disposal problems.

An approach to eliminating the problem of the use of hazardous chemicals is set forth in Ohmi et al, *J. Electrochem. Soc.*, Vol. 140, No. 3, March 1993, pp. 804–810, which describes the use of ozone-injected ultrapure water to clean organic impurities from silicon wafers at room temperature. However, this process also suffers several disadvantages. Ohmi et al provides only a process for the removal of a very thin layer of organic material, i.e., a layer of surfactant left from the lithography process. The process described by Ohmi et al could not remove photoresist in a reasonable time frame. The process was intended for, and works on organic contamination layers of less than 50 Angstroms. It is too slow to work on organic contamination layers of 50–250 mils. Thus, a process which can quickly and effectively remove organic materials of all thicknesses from semiconductor wafers without the use of hazardous chemicals is still not available in the art.

A process for the removal of organic materials during semiconductor manufacture which can avoid the foregoing problems while providing effective removal of organic materials would be of great value to the semiconductor industry. Further, an apparatus for conducting such a process which eliminates the need for multiple tanks would also be of great value to the industry.

Accordingly, it is an object of the present invention to provide a process for the removal of photoresist or other organic materials from semiconductor wafers which does not use hazardous chemicals.

It is still another object of the present invention to provide a process which does not require cool down tanks or idle stations due to chemical change out.

It is still another object of the present invention to provide a system for the fluid treatment of semiconductor wafers in which more than one treatment can be conducted without moving the wafers to a separate tank.

These and other objects of the present invention will become apparent upon a review of the following specification and the claims appended thereto.

SUMMARY OF THE INVENTION

The foregoing objectives are achieved by a process for removing organic materials from semiconductor wafers comprising contacting the wafers with a solution of ozone and water at a temperature of about 1° to about 15° C. The wafers are preferably contacted with the solution for a time sufficient to oxidize the organic materials from the wafers.

In another embodiment of the invention, a process for removing organic materials is provided comprising placing semiconductor wafers into a tank containing deionized water, diffusing ozone into the deionized water for a time sufficient to oxidize the organic materials from the wafers, maintaining the deionized water at a temperature of about 1° to about 15° C., and rinsing the wafers with deionized water. In a preferred embodiment, the organic material removed is photoresist.

In another embodiment of the invention, a process for removing organic materials from semiconductor wafers is provided comprising placing semiconductor wafers into a tank containing deionized water, diffusing ozone into the deionized water, simultaneously exposing the ozone to ultraviolet light as the ozone is absorbed and bubbled through the deionized water to form oxygen free radicals and oxygen molecules which oxidize the organic material to insoluble gases, maintaining the deionized water at a temperature of about 1° to about 15° C., and rinsing the wafers with deionized water.

The objects of the invention are further achieved by a tank for treatment of semiconductor wafers with a fluid comprising means connected to the tank for providing fluid into the tank, means for supporting at least one wafer within the tank in contact with the fluid, means connected to the tank for injecting gas into the tank, and means for diffusing the gas into the tank such that the gas is absorbed into the fluid and contacts the surface of each wafer disposed in the tank. The means for diffusing comprises a composite element having a permeable member and a nonpermeable member, the permeable member having a top portion and a bottom portion, a means defining an open space in a center portion of the permeable member, and a means defining a trench positioned on the top portion of the permeable member between an outer periphery of the permeable member and the means defining an open space. The impermeable member has a means defining an open space in a center portion of the impermeable member which corresponds to the means defining an open space in a center portion of the permeable member. The permeable member and the impermeable member are joined such that the trench opens at the top portion of the permeable member and is covered by the impermeable member. The composite element is positioned with the bottom portion of the permeable member connected to the bottom of the tank.

In a preferred embodiment, the tank comprises a first side and a second side, the first side of the tank having a vertical portion at a top portion of the tank and an inwardly tapered portion at a bottom portion of the tank, the tapered portion being longer than the vertical portion, and a second side of the tank having a vertical portion at a top portion of the tank and an inwardly tapered portion at a bottom portion of the tank, the tapered portion being shorter than the vertical portion.

The objects of the invention are further achieved by the gas diffuser of the present invention.

BRIEF DESCRIPTION OF THE DRAWINGS

FIG. 1 is a schematic diagram of a cross-section of a side view of an apparatus for the treatment of semiconductor wafers with fluid according to the present invention.

FIG. 2 is a schematic diagram of a cross-section of a front view of the tank of the present invention.

FIG. 3 is an exploded three-dimensional schematic diagram of a preferred embodiment of the gas diffuser of the present invention.

DETAILED DESCRIPTION OF THE PREFERRED EMBODIMENTS

The process of the present invention eliminates the need to use hazardous chemicals in the removal of organic materials from semiconductor wafers during the manufacturing process. Although ozone has little solubility in deionized water at room temperature or higher temperatures. Applicant has surprisingly discovered that ozone diffused through a subambient deionized water solution will quickly and effectively remove organic materials such as photoresist from wafers without the use of other chemicals. Although unexpected, it is believed that lowering the temperature of the solution enables a sufficiently high ozone concentration in solution to provide oxidization of substantially all of the organic material on the wafer to insoluble gases.

In photoresist removal, the process of the invention results in oxidation of the organic materials present to insoluble gases such as $CO_x$ and $NO_x$. These gases bubble out of solution and are exhausted from the system, usually into a hood or other exhaust apparatus.

In order to obtain the sufficiently high ozone concentration in the deionized water, the bath typically is maintained at about 1° to about 15° C. Below about 1° C., ice may form in the tank. Since these semiconductor process tanks are typically made from quartz, the ice may cause the quartz to break and prohibit movement of silicon wafers into and out of the process vessel. In addition, the system will not function since the water has changed physical states from a liquid to a solid and cannot absorb gases uniformly. Above 15° C., a sufficient amount of ozone may not be absorbed into the deionized water to remove the organic material on the semiconductor wafers in a timely fashion. In a preferred embodiment, the bath is about 5° C. to about 9° C.

The appropriate temperature can be maintained by any means known to those of skill in the art, including cooling the bath itself or, preferably, by continually supplying the bath with fresh, subambient deionized water. In a preferred embodiment, the water is used as a process chemical and all or a portion of the water is passed through a chiller prior to entering the treatment zone.

The wafers may be placed directly into a tank containing chilled ozonated water or, preferably, the wafers are placed in a tank of deionized water and ozone is diffused into the tank. Preferably, the ozone is diffused into the subambient water solution for a time sufficient to oxidize substantially all of the organic materials on the wafers. The amount of time needed for diffusion of the ozone into the water will depend on the nature of the organic material being removed and the amount of that material. The specific temperature of the water bath will also affect the time for diffusion of ozone since the amount of absorption of ozone into the water is dependent on the temperature and the oxidation power of the water solution is dependent on the amount of ozone absorbed.

Generally, the ozone will be diffused into the deionized water for about 1 to about 15 minutes. In a preferred embodiment, the ozone is diffused into the deionized water for about 5 to about 10 minutes.

In an alternative embodiment, ozone is diffused into the water solution and exposed to ultraviolet radiation from an ultraviolet light source in order to produce oxygen free radicals and oxygen molecules which oxidize the organic material or photoresist on the wafers.

After the ozone in the water solution sufficiently oxidizes the organic material, the wafers are rinsed with fresh deionized water for about 1 to about 5 minutes. This rinse step generally will be at ambient temperature. In a preferred embodiment of the invention, the wafers are rinsed a second time with deionized water heated from about 65° C. to about 85° C. in order to remove water soluble metals, such as sodium and potassium, from the surface of the wafers. The alkali and alkali earth metals originate from contaminates in the photoresist.

The removal of the organic material by the process of the invention can take place in any type of wafer bath or wafer cleaning apparatus. However, the ozonated water process of the present invention operates by oxidizing the photoresist or other organic material upon ozone contact with each wafer in solution. Therefore, the ozone must be dispersed in the tank in such a manner that each wafer is contacted by ozone.

Unlike the sulfuric acid process where the resist is lifted off the wafer and digested in the chemical (oxidized), the ozonated water process of the present invention does not lift resist from the wafer, but oxidizes the photoresist only upon ozone contact with the wafer. If the ozone is not properly dispersed in the tank or the wafers are shielded due to wafer containment vessels, the resist will not be removed. Thus, it is preferable that the ozone is present in the tank such that it is sufficiently absorbed into the water and uniformly contacts the face of each wafer in the treatment zone. With this method, there is direct oxidation of the organic photoresist to insoluble gases, eliminating the problem of particle build up within the bath and the need for filtration equipment.

In a preferred embodiment, the process of the invention is conducted in the apparatus of FIG. 1. Processing takes place in a hooded, exhausted wet station, with proper ozone monitoring and catalytic destruct equipment in place. Resisted wafers or other wafers from which organic materials are to be removed are introduced into process tank 13 filled with subambient deionized water (1°–15° C.). The tank operates in a low flow (about 0.5 gpm) cascade mode, with water feed line 7 running through chiller 8 during processing in order to supply a continuous stream of chilled deionized water. Ozone from the ozone generator 6 is then diffused through conduit 5 into the tank through an in-situ diffuser 4. The resist strip is timed, after which the ozone is turned off and the wafers are rinsed by the continuous high flow (about 10–15 gpm) of deionized water. The drain line 12 is diverted to deionized water reclaim 10, and fresh deionized water is activated for the rinse. After a timed ambient deionized water rinse, the wafers may optionally receive a hot deionized water rinse.

In a particularly preferred embodiment of the invention, the process is conducted in the tank of FIG. 2 which contains the gas diffuser of FIG. 3. However, although the apparatus of FIG. 1, the tank of FIG. 2 and the gas diffuser of FIG. 3 of the present invention are particularly preferred for use with the ozonated water process of the present invention, they may also be used for conducting any fluid treatment of semiconductor wafers. Specifically, previously known methods of removing organic materials from wafers may be used in the apparatus and tank of the invention. Applicant has found that the apparatus of the present invention can be used to efficiently carry out previously known processes without the need for multiple tanks. Moreover, the apparatus of the present invention provides the ability to generate chemicals in-situ, avoiding the problem of aging chemicals or transfer of hazardous chemicals from remote locations.

The preferred apparatus for treatment of semiconductor wafers with a fluid includes a tank for use in a hooded, exhausted wet station. The tank generally will have means connected to the tank for providing fluid into the tank, means for supporting at least one wafer within the tank in contact with the fluid, means connected to the tank for injecting gas into the tank, and means for diffusing the gas into the tank such that the gas is absorbed into the fluid and contacts the surface of each wafer disposed in the tank.

FIG. 1 illustrates a preferred embodiment of the claimed invention. The tank 13 holds the fluid to be used to treat semiconductor wafers.

The means for providing fluid to tank 13 generally will be a conduit connected to the tank, but any device or apparatus known to those of skill in the art for providing a flow of fluid to a tank may be utilized. Fluid can be provided to the tank, for example, by perfluoroalkoxylvinylether (PFA) tubes or pipes, polytetrafluoroethylene (PTFE) tubes or pipes, polyvinylidene fluoride (PVDF) tubes or pipes, or quartz tubes. Preferably, PFA tubes or pipes are utilized. In a preferred embodiment, PFA tubes are connected to the tank with a flared fitting connection.

In the preferred embodiment shown in FIG. 1, the means for providing a fluid is through feed line 7 at the bottom of the tank, with the fluid flowing in an upwardly direction into tank 13. Generally, the tank will be operated on a continuous overflow basis, so that as the fluid flows upward from the means for providing fluid and reaches the top of the tank, the fluid will overflow out of the tank into overflow weir 1 allowing for fresh fluid to be introduced at the bottom of the tank. This method of introducing and removing fluid from a treatment tank is well known in the semiconductor manufacturing art.

From overflow weir 1, fluid is fed into return line 12. A three way valve 11 operates to either recirculate the fluid by way of line 9 or drain the fluid through drain line 10.

The means for injecting a gas into the tank can be any means known to those of skill in the art for providing a gas to a tank for treatment of semiconductor wafers. The gas can be plumbed to the diffuser, for example, with either a PFA tube or a PTFE tube or pipe. Preferably, PFA tubing with a flared fitting is used to inject the gas into the tank.

FIG. 1 shows the means for injecting a gas into the tank at 5 which is connected to the tank at the bottom of the tank, below the means for diffusing the gas into the tank. Conduit 5 feeds directly into diffuser 4 to provide a uniform flow of gas to the tank.

The means for supporting at least one wafer within the tank in contact with the fluid (shown in FIG. 2) can be any means known to those of skill in the art for placing a wafer in contact with a treatment solution. Wafer boats and cassettes useful for this purpose are well known.

Preferably, when the ozonated water process of the invention is to be carried out in the tank, the boat or cassette will allow uniform fluid flow across each wafer in the tank. In a preferred embodiment, for purposes of allowing the maximum freedom of fluid flow across the wafers, a cassetteless system of supporting the wafers in the tank is utilized. A preferred support system is by the use of four rod end effector 15 (FIG. 2) which allows the wafer to be contacted in only two points by the support. FIG. 2 shows the end view of the four rails of the support attached to an end plate. The points of contact are at the 5 and 7 o'clock positions and the depth of the wafer groove is no greater than about 2 mm. In the most preferred embodiment, the wafer support system securely supports the silicon wafers at a slight angle with uniform spacing between the wafers.

The means for diffusing a gas can be any means which provides fine bubbles of ozone or other gases into the tank and uniformly distributes the gas throughout the tank, ensuring that each wafer is contacted by the gas absorbed into the fluid. Preferably, the bubbles which are provided by the diffuser are initially about 25 to about 40 microns in diameter.

The means for diffusing a gas can be utilized to deliver any gas to the tank to be used in a fluid treatment, such as hydrochloric gas, ammonia, hydrofluoric gas, chlorine gas or bromine. These gases can be sent through the diffusing means either individually or in combinations with or without ozone to effect different chemistries in the process tank.

Preferably, the means for diffusing a gas comprises a composite element having a permeable member and a nonpermeable member. The permeable member has a top portion and a bottom portion, a means defining an open space in a center portion of the permeable member, and a means defining a trench positioned on the top portion of the permeable member between an outer periphery of the permeable member and the means defining an open space. The impermeable member has a means defining an open space in a center portion of the impermeable member which corresponds to the means defining an open space in a center portion of the permeable member. The permeable member and the impermeable member are joined such that the trench on the top portion of the permeable member is positioned between the permeable member and the impermeable member. The composite element is preferably positioned with the bottom portion of the permeable member connected to the bottom of the tank. Thus, the permeable portion of the composite element faces toward the bottom of the tank and the impermeable portion of the composite element faces toward the top of the tank. The open portion of the trench is between the two members on the inside of the composite element.

Gas diffuser 4 of the present invention operates by allowing gas received into the diffuser to diffuse through the pores of the permeable member into the fluid solution. The gas first flows into the trench portion of the permeable member since that area offers the least resistance to the flow of gas. As the gas pressure increases, the gas which has flowed into the trench diffuses through the pores of the permeable member out into the tank. Since the impermeable member on top of the permeable member prevents the flow of gas out the top of the diffuser, the gas diffuses out the bottom and sides of the diffuser, flowing downward. When the means for providing fluid is at the bottom of the tank, this downward flow of the gas is countercurrent to the flow of fluid, allowing for excellent absorption of the gas into the fluid flowing upwardly into the tank.

It is desirable for the diffuser to be hydrophobic to prohibit water backstreaming into the gas lines which may lead to metal corrosion at the gas regulation box. Moreover, the diffuser should be chemically compatible with ozone and chemically pure to avoid entrainment of cations, anions or particles into the process bath.

The gas diffuser preferably is made from a mixture of polytetrafluoroethylene (PTFE) and perfluoroalkoxylvinylether (PFA). By varying the temperature and pressure under which the mixture is prepared by methods known in the art, both porous and nonporous members are formed. The impermeable and permeable members are preferably comprised of about 95% PTFE and about 5% PFA. The permeable member and the impermeable member may be joined by any number of methods as long as the result is a composite member that will not come apart under the stresses in the tank. Preferably, the members are heat sealed together, essentially melting or fusing the members together using carbon-carbon bonds.

Once the permeable member is formed, a trench is bored out of the PTFE in the top portion of the member. The resulting diffuser has on the order of about 100,000 pores of a size of about 25 to about 40 microns in diameter through which gas may permeate into the treatment tank. The use of the trench in the diffuser allows the gas to diffuse into the tank as very fine bubbles which can be easily absorbed into the fluid and uniformly distributed throughout the tank.

A diffuser according to a preferred embodiment of the invention is shown in FIG. 3. Impermeable member 30 is the top portion of the composite element. Permeable member 31 is the bottom portion of the composite element which has trench 32 bored out of it to provide uniform distribution of the gas throughout the tank. The preferred rectangular configuration of the diffuser is as shown in FIG. 3. However, different configurations may be used such as parallel rods for square or rectangular tanks or circular diffusers for round or cone-shaped tanks. In a preferred embodiment, the diffuser is about one-quarter the area of the bottom of the tank.

The diffuser sits at the bottom of the tank and may be attached to the tank by any appropriate means. Preferably, the diffuser is attached to the tank utilizing unused end plugs. The plugs are inserted into the diffuser first and then the entire assembly is mounted in the tank. Conduit 5 feeds gas directly into the diffuser from the bottom of the tank. This enables the gas to enter the trench and then diffuse out the bottom and sides of the permeable member in a uniform manner.

The tank of the preferred embodiment is shown in FIG. 2 (labels correspond to FIG. 1), further illustrating wafer 14 held by preferred support 15 in tank 13. Tank 13 has at least two sides with inwardly tapered portions for reducing the volume of chemicals which are required for treatment of the wafers. One of the sides has a vertical portion at the top of the tank and an inwardly tapered portion at the bottom of the vessel with the tapered portion longer than the vertical portion and a second side of the tank has a vertical portion at the top of the tank and an inwardly tapered portion at the bottom of the vessel with the tapered portion shorter than the vertical portion. This tank structure reduces the volume of chemicals used during treatment by about 27% and allows for a quick turn-over in the chemical composition of the solution in the tank.

The structure of tank 13 also provides advantages when using megasonic transducers. Tank 13 may have one or more megasonic transducers 2 mounted thereon for agitation of the solution. The transducers are preferably oriented between perpendicular and 30° off perpendicular to the gas stream with the wafers oriented parallel to the megasonic beam.

The megasonics in a preferred embodiment are mounted on the side of the tank with the longer taper. Opposite this side is a shorter tapered side. The sides are tapered to accomplish two functions. The first is to insure the megasonic power does not reflect off the far wall and return to the transducers. Such reflected energy would result in burning up the transducers and thereby lead to a short component lifetime. The second reason for the choice of the tapered walls is to pass the megasonic power through the zone where the volume of silicon wafers is to be processed and use the reflected beam off the far wall to make a second pass through the zone of silicon wafers. In doing so, each megasonic pulse has two passes through the wafers to increase the particle removal efficiency.

Tank 13 may also be fitted with ultraviolet light source 3 for subjecting the solution to UV radiation. The UV source can be mounted on the outside of the tank or, preferably, is submerged into the tank and placed over diffuser 4, as shown at 3 in FIG. 1 and FIG. 2. The UV light can be utilized to generate oxygen free radicals and oxygen molecules from ozone bubbled directly into the treatment tank for removal of organic materials on wafer 14 during operation of the ozonated water process of the invention.

In a further embodiment, the tank is fitted with a lid for closing the tank which has an infrared light source mounted in the lid. The infrared light may be used to aid in drying the wafers after treatment. The infrared light source is disposed in the lid such that the light source is above the fluid in the tank when the lid is closed and is directed downward into the fluid. In a preferred embodiment, the IR light is used in conjunction with a solvent drying process wherein an appropriate hydrocarbon solvent is introduced on the top of the fluid in the tank and the wafers are slowly lifted through the solvent layer so that the solvent layer displaces the water from the wafers. Any solvent remaining on the wafers is vaporized by the process of heating the wafers using the IR lamp to about 150° C.±30° C. and introducing ozone gas to oxidize the organic remnants. Other methods of drying the wafers are known in the art and use of any such methods are contemplated by the invention.

While the apparatus for treatment of semiconductor wafers with fluids, the tank and the diffuser discussed herein are preferably used with the ozonated water process of the present invention, the structure provided is also useful with a number of other treatment processes. The apparatus provided eliminates the need to use multiple tanks by providing a means to generate chemicals in-situ so that several steps of a process may be conducted in one tank without moving the wafers. Thus, the diffuser may be used to introduce any gases into the tank needed for fluid treatment or for formation of fluids for treatment of semiconductor wafers. One of ordinary skill in the art is familiar with the tank materials needed when using various gases.

For example, both the sulfuric acid cleaning process and the RCA cleaning process described above can be conducted in the present apparatus quickly and efficiently without the need for multiple tanks or separate mixing tanks.

For the sulfuric acid process, acid enters a tank through a delivery tube in the weir, so that the acid goes to filtration first before entering the process area of the tank. Delivery of acid from a recirculating unit is through the bottom of the tank. After wafers with photoresist are introduced to the process area of the tank, ozone is diffused into the tank while megasonic transducers are activated. The other configuration of the sulfuric acid clean using ozone is to diffuse ozone ($O_3$) into the tank through the diffuser with the resisted wafers present, then activate the UV light. The UV light will generate the oxygen free radical to react directly with the organic matter on the silicon wafers and to act as an oxidant which reacts with the sulfuric acid to form the traditional Caro's Acid which reacts with the photoresist. This reaction is simultaneous with the sonic energy of the dual frequency transducers.

For the RCA clean, the tank operates in overflow mode. Deionized water cascades continuously at a variable flow rate (0.5, 1, 5 and 10 gpm), or the tank is in static mode. The wafers are first rinsed, then the water cascade is turned off. Ozonated water is generated in the tank and/or is pumped into the tank and then the ammonia gas ($NH_3$) is diffused into the tank to create the SC1 solution. Optionally, ozone in conjunction with UV radiation may be used to generate the oxygen free radical. The megasonic transducers are activated, operating in dual frequency mode and firing alternately in order to prevent overheating of the crystals. After processing, the water cascade is turned on to flush (from the bottom of the tank) the SC1 solution from the tank. The water flush/rinse is timed and the drain may also have a resistivity monitor in-line. When the tank and wafers are rinsed, the water line switches to hot deionized water to elevate the temperature in the process tank. When the tank temperature reaches 70° C., the overflow is turned off and the tank returns to static mode ozone gas is then diffused into the tank, followed by hydrochloric gas, to create the SC2 solution. Optionally, ozone in conjunction with UV radiation may be used to generate the oxygen free radical. The megasonic transducers are activated. After processing, the water cascade is turned on to flush the tank and rinse the wafers based on time and resistivity. A final rinse is performed with hot deionized water based on time.

Various modifications and alterations of this invention will become apparent to those skilled in the art without departing from the scope and spirit of this invention, and it should be understood that this invention is not to be unduly limited to the illustrative embodiments set forth herein.

What is claimed is:

1. A tank for treatment of semiconductor wafers with a fluid having multiple sides and a bottom, comprising:

means connected to the tank for providing fluid into the tank;

means for supporting at least one wafer within the tank in contact with the fluid;

means connected to the tank for injecting gas into the tank; and means for diffusing the gas into the tank such that the gas is absorbed into the fluid and contacts the surface of each wafer disposed in the tank, said means for diffusing comprising a composite element having a permeable member and a nonpermeable member, said permeable member having a top portion and a bottom portion, means defining an open space in a center portion of the permeable member, and means defining a trench positioned on the top portion of the permeable member between an outer periphery of the permeable member and the means defining an open space, said impermeable member having a means defining an open space in a center portion of the impermeable member which corresponds to the means defining an open space in a center portion of the permeable member, the permeable member and the impermeable member being joined such that the trench opens at the top portion of the permeable member and is covered by the impermeable member, and the composite element being positioned with the bottom portion of the permeable member connected to the bottom of the tank.

2. The tank of claim 1, wherein both the permeable member and the impermeable member comprise a mixture of polytetrafluoroethylene and perfluoroalkoxylvinylether.

3. The tank of claim 1, wherein the tank comprises a first side and a second side, the first side of the tank having a vertical portion at a top portion of the tank and an inwardly tapered portion at a bottom portion of the tank, the tapered portion being longer than the vertical portion, and a second side of the tank having a vertical portion at a top portion of the tank and an inwardly tapered portion at a bottom portion of the tank, the tapered portion being shorter than the vertical portion.

4. The tank of claim 3, further comprising a megasonic transducer located on the inwardly tapered portion of the first side of the tank.

5. The tank of claim 4, further comprising an ultraviolet light source located inside the tank above the means for diffusing the gas.

6. The tank of claim 5, wherein the means for injecting gas is disposed below the means for diffusing the gas such that the gas is injected upwardly into the means for diffusing.

7. The tank of claim 6, wherein the means for providing fluid into the tank provides the fluid flow in a first direction and the means for injecting gas into the tank provides the gas in a second direction, countercurrent to the fluid flow.

8. The tank of claim 1, wherein the means for injecting gas into the tank provides a gas either individually or in combination with one or more different gases.

9. A gas diffuser for use in a tank for the fluid treatment of semiconductor wafers comprising:

a composite element having a permeable member and a nonpermeable member, said permeable member having a top portion and a bottom portion, a means defining an open space in a center portion of the permeable member, and a means defining a trench positioned on the top portion of the permeable member between an outer periphery of the permeable member and the means defining an open space, said impermeable member having a means defining an open space in a center portion of the impermeable member which corresponds to the means defining an open space in a center portion of the permeable member, the permeable member and the impermeable member being joined such that the trench opens at the top portion of the permeable member and is covered by the impermeable member, and the composite element is positioned with the bottom portion of the permeable member connected to a bottom portion of the tank.

10. The gas diffuser of claim 9, wherein both the permeable member and the impermeable member comprise a mixture of polytetrafluoroethylene and perfluoroalkoxylvinylether.

11. A tank for treatment of semiconductor wafers with a fluid having multiple sides and a bottom, comprising:

means connected to the tank for providing fluid into the tank;

means for supporting at least one wafer within the tank in contact with the fluid;

means connected to the tank for injecting gas into the tank; and means for diffusing the gas into the tank such that the gas is absorbed into the fluid and contacts the surface of each wafer disposed in the tank, said means for diffusing comprising a composite element having a permeable member and a nonpermeable member, said permeable member having a top portion and a bottom portion, means defining an open space in a center portion of the permeable member, and means defining a trench positioned on the top portion of the permeable member between an outer periphery of the permeable member and the means defining an open space, said impermeable member having a means defining an open space in a center portion of the impermeable member which corresponds to the means defining an open space in a center portion of the permeable member, the permeable member and the impermeable member being joined such that the trench opens at the top portion of the permeable member and is covered by the impermeable member, and the composite element being positioned with the bottom portion of the permeable member connected to the bottom of the tank;

means for chilling the fluid to a temperature of about 1° C. to 10° C.

* * * * *